United States Patent [19]

Smith

[11] Patent Number: 5,017,419

[45] Date of Patent: May 21, 1991

[54] NON-MOIRÉ SHIELDED WINDOW

[75] Inventor: David C. Smith, Chelmsford, Mass.

[73] Assignee: Chomerics, Inc., Woburn, Mass.

[21] Appl. No.: 337,683

[22] Filed: Apr. 13, 1989

[51] Int. Cl.$^5$ .............................................. H05K 9/00
[52] U.S. Cl. .................................... 428/209; 174/35 R; 174/35 MS; 350/321; 428/192; 428/210; 428/426; 428/432; 428/433; 428/461; 428/500; 428/913
[58] Field of Search ............... 174/52.2, 35 R, 35 MS, 174/257, 260; 428/426, 432, 433, 195, 913, 423.1, 500, 412, 901, 457, 461, 192, 209, 210; 358/252; 313/470; 350/321

[56] References Cited

U.S. PATENT DOCUMENTS

| 2,942,254 | 6/1960 | Beers | 358/252 |
|---|---|---|---|
| 3,194,885 | 7/1965 | Hamilton | 358/252 |
| 3,215,777 | 11/1965 | Hamilton | 358/252 |
| 3,253,082 | 5/1966 | Buset | 174/35 R |
| 3,277,455 | 10/1966 | Viret et al. | 358/252 |
| 3,650,718 | 3/1972 | Ogland | 65/23 |
| 3,729,616 | 4/1973 | Gruss et al. | 219/522 |
| 3,962,488 | 6/1976 | Gillery | 427/109 |
| 4,223,083 | 9/1980 | Engstrom | 430/24 |
| 4,251,610 | 2/1981 | Haven et al. | 430/25 |
| 4,412,255 | 10/1983 | Kuhlman et al. | 358/245 |
| 4,565,719 | 1/1986 | Phillips et al. | 428/34 |
| 4,707,586 | 11/1987 | Voss et al. | 219/203 |
| 4,710,433 | 12/1987 | Rowe | 428/623 |
| 4,720,770 | 1/1985 | Jameson | 174/25 R |
| 4,721,845 | 1/1988 | Kunert et al. | 219/203 |
| 4,725,710 | 2/1988 | Ramus et al. | 219/203 |
| 4,743,741 | 5/1988 | Ramus | 219/543 |
| 4,744,844 | 5/1988 | Hurst | 156/101 |
| 4,755,659 | 7/1988 | Leon et al. | 219/547 |
| 4,771,167 | 9/1988 | Boulos et al. | 219/547 |
| 4,772,760 | 9/1988 | Graham | 174/35 |
| 4,845,310 | 7/1989 | Postupack | 174/35 R |
| 4,932,755 | 6/1990 | Holdridge et al. | 350/321 |

FOREIGN PATENT DOCUMENTS 2854573 12/1978 Fed. Rep. of Germany .
111253 2/1975 German Democratic Rep. .

OTHER PUBLICATIONS

A New and Unique Element for Aircraft Transparencies by Jan B. Olson et al.

Primary Examiner—Ellis P. Robinson
Assistant Examiner—Archene Turner
Attorney, Agent, or Firm—John Dana Hubbard; William L. Baker

[57] ABSTRACT

A shielded substrate is disclosed which has a randomly oriented, non-linear conductive pattern formed on at least one surface of the substrate. The conductive pattern provides excellent EMI-RFI shielding and visual opacity properties without generating moiré patterns. The conductive pattern is formed of a series of interconnecting non-linear, conductive elements, such as circles, ovals, ellipses and polygonal shapes. The conductive substrate may be formed through the use of photolithography process.

20 Claims, 1 Drawing Sheet

NON-MOIRé SHIELDED WINDOW

This invention relates to a shielded window, more particularly, it relates to an EMI/RFI shielded window that prevents the generation of moiré patterns.

BACKGROUND OF THE INVENTION

A normal cathode ray tube (CRT) such as is used in a computer terminal is composed of a transparent screen with a phosphor layer formed on its inner surface. The phosphor layer is stimulated by one or more electron beams so that the layer emits light energy. This light energy is the visual representation viewed by an observer of the screen.

The screen and tube are typically not shielded against the radiation of EMI/RFI energy generated within the CRT. The ingress and egress of EMI/RFI energy must be controlled for health and security reasons. For example, recent studies have suggested that the EMI/RFI energy emanating from CRT devices may affect the health of its users. Additionally, it is known that EMI/RFI emissions from CRT devices can affect the operation of adjacent unshielded devices and may also be detected and read by highly sensitive detectors.

One approach to eliminating the movement of EMI/RFI energy through the CRT screen has been to use a transparent shield which contains an electrically conductive mesh or grid. Mounting such mesh is difficult and time consuming as the mesh tends to tear easily. The shielded structure suffers from reduced visual opacity in that the mesh interferes with one's viewing of the screen. More importantly, the use of the conductive mesh causes the formation of moiré patterns which interfere with the viewing of the screen.

Moiré patterns are caused by the overlaying of two patterns which are similar in spatial frequency and distribution. In CRT devices, they are caused by the overlaying of two similar grid patterns. The first grid is the wire mesh used in the EMI/RFI shielding device. The second grid is formed by the CRT scan lines and pixel delineation. The frequency and distribution of the second grid is variable as each CRT screen has different spatial distributions. The problem is more severe when using a high resolution screen, as the spatial definition of the pixels is closer to that of the wire screen, thus generating more moiré patterns.

One method for avoiding the generation of moiré patterns is to eliminate the wire mesh, while maintaining the EMI/RFI shielding. Various coated shields or screens have been offered and while the shields do reduce or eliminate the moiré patterns, they also have major disadvantages. The main problem with such coatings is that the visual opacity of the CRT screen is significantly reduced (generally up to 50% less than on an unshielded screen). This requires the operator to increase the screen's luminescence to a higher level which reduces the useful life of the screen. Additionally, the coatings are generally less conductive than the wire mesh and therefore do not provide the same effective level of EMI/RFI shielding.

The present invention overcomes the difficulties encountered with the present devices. The shield of the present invention provides excellent EMI/RFI shielding and visual opacity without generating moiré patterns.

SUMMARY AND OBJECTS OF THE INVENTION

The present invention is a randomly oriented non-linear conductive pattern useful as an EMI/RFI shield on CRT screens and similar devices. The random, non-linear pattern provides excellent EMI/RFI shielding capabilities without generating moiré patterns.

It is an object of the present invention to provide a transparent EMI/RFI shield with good visual opacity and which does not cause the generation of a moiré pattern.

Another object of the present invention is to provide an EMI/RFI shield comprising a substrate which is transparent or translucent and a shielding means formed of a non-regular, random oriented circular pattern.

A further object of the present invention is to provide a method of forming an EMI/RFI shield for CRT devices that does not generate moiré patterns comprising the steps of generating a randomly oriented, non linear circular pattern, creating a photomask of such pattern, imaging the pattern onto a resist formed on a transparent substrate, developing the resist, etching away a selected portion of the resist and/or substrate so as to form the pattern on the substrate, plating the resultant pattern to render it conductive and applying a conductive termination layer along the edges of the substrate so that the shield is electrically continuous with the CRT device.

These and other objects of the present invention will be made clear from the specifications, drawings and appended claims.

DESCRIPTION OF THE DRAWINGS

FIG. 3 shows a cross-sectional view of a preferred embodiment of the present invention.

FIG. 4 shows a cross-sectional view of a further embodiment of the present invention.

DETAILED DESCRIPTION OF THE INVENTION

The present invention relates to a highly conductive, randomly oriented, non-linear pattern formed on a transparent or translucent substrate for use in EMI/RFI shielding applications.

Figure 1:
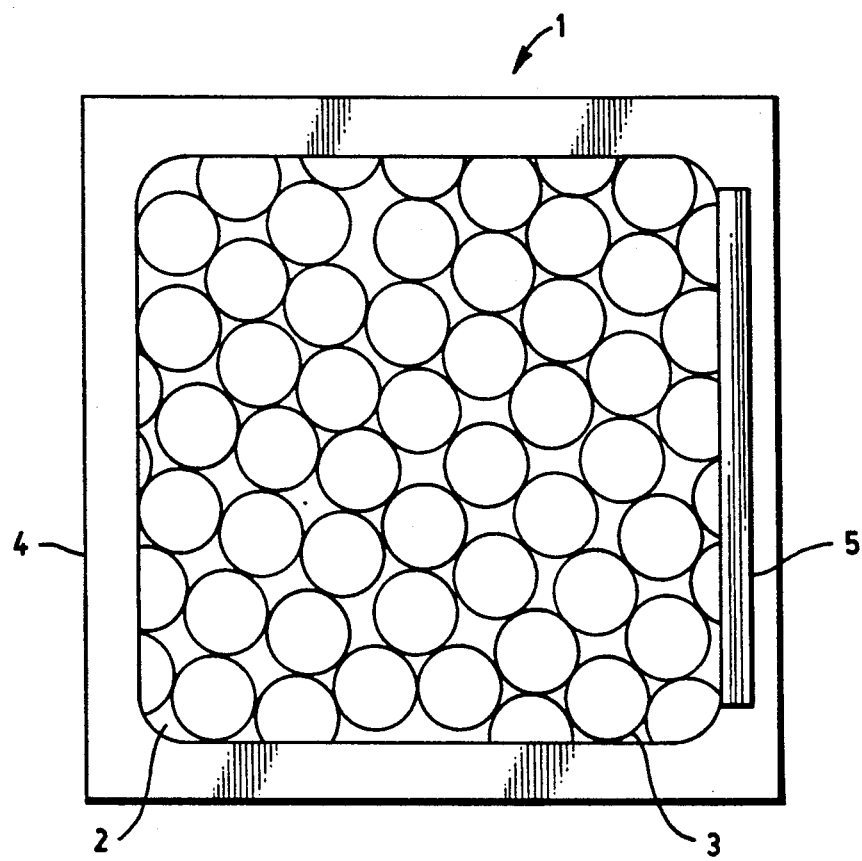
FIG. 1 shows a planar view of a preferred embodiment of the present invention.

In a preferred embodiment of the present invention as shown in FIG. 1, a conductive window or screen 1 having a randomly oriented, non-linear pattern 2 based upon a series of interconnecting elements 3 is shown.

By randomly oriented, it is meant that the elements 3 do not form a linear or grid-like pattern which causes the generation of moiré patterns.

The window 1 comprises one or more layers of a transparent or translucent substrate 4. The substrate 4 may be formed from such materials as glass, and various rigid plastics, either thermoplastic or thermoset including but not limited to polyacrylates and polycarbonates. At least one surface of the substrate 4 contains a conductive pattern 2 formed of interconnected electrically conductive elements 3. In this preferred example, the elements 3 are shown as circles.

The elements 3 are shown as being in contact with each of their surrounding elements so that electrical continuity is maintained throughout the pattern 2.

While each element 3 is in contact with its neighboring elements, the elements are arranged so that they do not overlap each other as overlapping tends to reduce the visual opacity of the conductive screen.

While the elements 3 in FIG. 1 are shown to be circles, it has been found that any configuration which does not create a linear, regular and/or grid-like pattern and thus does not cause moiré patterns to form, may be useful in the present invention. Other configurations that are useful include but are not limited to various curved shapes such as ellipses and ovals and various polygonal shapes.

It is preferred that the elements 3 have a rounded configuration with a circular or oval configuration being more preferred.

The size of the elements 3 depends in large part upon the shielding and visual opacity characteristics desired. The smaller the elements, the greater the shielding characteristics and the lesser the visual opacity and vice versa. Preferably the selected elements 3 should be of size such that they do not severely detract from either characteristic.

Two dimensions are relevant in discussing the size of the elements 3; the diameter of the elements and the annular width of the elements.

With circular elements 3, the diameter will be the same as the outer diameter of the circle. However, with other shapes such as ovals or irregularly shaped elements, the diameter is more difficult to determine.

Diameter of the elements 3 is herein defined as the longest distance by a straight line from one outer edge of an element to an opposite outer edge of the element.

Thus for example in an oval element having a long diameter of 0.1 inches and short diameter of 0.05 inches, the diameter of the element would be defined as 0.1 inches.

The annular width is herein defined as the distance from an outer edge of the conductive band of an element to corresponding inner edge of the conductive band. If a variation in annular width occurs, either due to the manufacturing process or due to a desired purpose, the annular width shall be an average of the distances taken from various points around the circumference of the element. The annular width of an element should be fairly consistent throughout.

Figure 2:
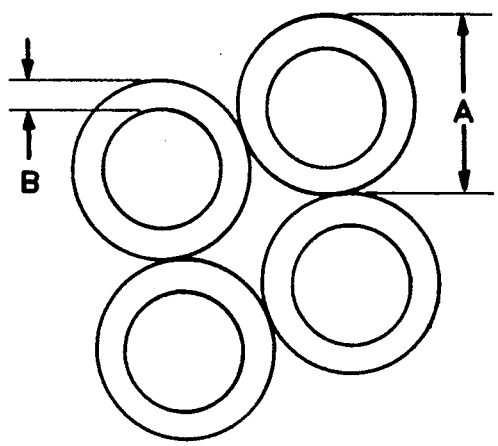
FIG. 2 shows a magnified view of a portion of the conductive pattern of FIG. 1.

FIG. 2 shows a closeup of a portion of FIG. 1 wherein the diameter of the element 3 and the annular width are depicted respectively by the letters A and B.

Preferably, the diameter of the elements ranges from about 0.002 inches to about 0.10 inches. More preferably, the diameter of the elements is about 0.010 inches. The annular width of the elements ranges from about 0.0002 inches to about 0.005 inches, preferably about 0.001–0.002 inches.

If desired, the elements 3 of a pattern 2 may vary over a range of diameters. For example, if one wishes to have less visual opacity around the edge of the conductive substrate 4, one may use an element 3 along the edge of the substrate 4 that has a smaller diameter than the elements 3 on the inner portion of the substrate 4. Also, it is preferred to use elements of different sizes to ensure that there is complete and adequate conductivity throughout the pattern. Due to the random orientation of the elements, it might be necessary to use some elements of a smaller diameter than the rest to fill in any gaps that might exist in the pattern.

Likewise, as discussed above, one may vary the annular width of the conductive band of each element 3 so that one portion of the band is thicker or thinner than the remainder of the band. Likewise, one may use elements 3 having different annular widths to create a desired pattern.

Preferably, the conductive pattern 2 is terminated along its outside edges with a conductive strip, commonly called a bus bar 5.

The bus bar 5 may be a conductive layer formed on or in the surface of the substrate. The bus bar 5 can be formed in a manner identical to the formation of the pattern except preferably it is void free. However, if desired, one could use elements 3 that are smaller in diameter and/or thicker in annular width along the edges of the pattern 2 to form the bus bar 5.

Additionally, the bus bar 5 can be formed of a separate conductive layer sintered or bonded to the edge areas of the substrate 4. For example, the bus bar 5 can be a conductive ink or epoxy, a conductive metal plating, a metal strip, a conductive, sinterable frit such as silver coated glass, or more preferably, a conductive metal tape, such as CHO-FOIL®, available from Chomerics, Inc.

The bus bar 5 is designed in such a manner that it establishes and maintains electrical continuity between the substrate 4 and the frame, cabinet or closure to which it is attached. The bus bar 5 may do so directly, i.e. its surface meets and mates with a conductive surface of the frame, cabinet or closure to which the substrate is attached.

Preferably, the bus bar is connected to a conductive lead such as a grounding strap, a metal frame, or a conductive gasket that establishes contact with the surface to which the substrate is mounted. By using the intermediate connection between the bus bar of the substrate and surface, one avoids the problems of establishing a perfect fit between the surfaces as would be required by a direct connection between the surface and the substrate.

FIG. 3 shows another preferred embodiment of the present invention.

The surface 6 of the substrate 4 containing the pattern 2 may also be covered by a protective coating 7, such as a conformal coating to prevent oxidation and damage to the conductive pattern during handling. Such coatings are well known and generally are formed of a sprayable plastic material, such as polyurethane. The coating can also be a film, such as MYLAR® films or KAPTON® films, which may be bonded to the substrate surface.

The surface 6 of the substrate 4 containing the pattern 2 may also be covered by a transparent conductive coating, such as indium tin oxide. This coating may be applied by vacuum deposition, sputtering, or spray pyrolysis. The addition of this conductive coating will increase the effective shielding of the assembled window.

If desired, the substrate 4 can be joined with another substrate 8 to form a laminate of two or more layers, as shown in FIG. 4. In this embodiment, the surface 6 of the substrate 4 containing the conductive pattern 2 faces the inner surface 8 of the other substrate 8. Such laminations and processes for forming them are well known and generally consist of a bonding layer 9 between the substrates to hold the two substrates together. Typically, a polyvinyl butryl material is used as the bonding agent, although other similar adhesive materials such as polyurethanes can be used. Alternatively, the two substrates can be melt bonded together, although one must take care not to injure the conductive pattern in doing so.

A preferred method of forming the pattern on the conductive window of this invention is by a photolithography or an electroforming method.

In the preferred process, a desired pattern is first created. The pattern can be drawn by hand or preferably by a computer generated program. A preferred simple means for creating the randomly oriented pattern of the present invention is to use a computerized print program which will lay out a series of elements of the desired size and shape in an arrangement so that the elements are randomly disbursed, but continuously conductive to each other. Additionally, if desired, the program can be made so that the amount of overlapping is minimal. A photomask is made of the pattern and imaged onto a resist coated substrate. The resist coated substrate is exposed to actinic radiation and developed. The developed image is then plated to form a conductive pattern.

A suitable computer program used to generate the pattern follows the following logic: A circle of the predetermined diameter is placed randomly in the screen area. A second circle is drawn tangent to the first, but randomly placed around the diameter. Third and consecutive circles are drawn tangent to the previous circle, so that a randomly wandering "chain" is created. When the chain reaches the border, it is truncated and started again elsewhere in the array. Care is taken to keep track of where the circles are placed, so that subsequent circles are not allowed to overlap. The array is filled in this fashion. When a reasonable number of random tries does not locate an open space, the program changes to a search mode, whereby open spaces are located and filled with the same size circles. When this is complete, smaller spaces are located and filled with smaller circles, and finally smaller spaces yet are found and filled with smaller circles. (The difference in diameters between the largest and smallest circles is variable by choice, but in general can be up to 50%). The output of the computer program is the circle diameter and X/Y coordinate which is used to drive a computer plotter or photomask generator.

In one preferred embodiment, one can form the pattern on a resist coated substrate which will form the conductive window. This substrate may be formed of any transparent or translucent material typically used for such conductive windows. Examples of such materials include, but are not limited to, glass and various plastics such as polycarbonates and polyacrylates. In this embodiment, the resist is formed on the desired surface of the substrate. The resist is then exposed to the pattern formed on a photomask and developed. The substrate is then etched, preferably with an acid, to create the desired pattern in the substrate surface. The etched pattern is then filled with a conductive material such as a conductive ink a conductive adhesive, preferably a conductive epoxy, a conductive frit, such as a conductive ceramic frit, or a conductive metal, such as copper, silver, nickel, gold, tin, zinc, aluminum or platinum. It is preferred to use a conductive adhesive, especially a silver filled epoxy. If desired, the conductive pattern may additionally be plated with conductive metals, such as, but not limited to silver, gold, platinum, nickel, tin, zinc, aluminum or copper to enhance its conductivity and reduce oxidation.

Another embodiment is to use a resist coated metal layer substrate to form the desired pattern. The substrate has a metal layer bonded or plated onto its desired surface. The metal layer is coated with a resist layer. The resist is exposed and developed and the unwanted portion of the metal layer is etched away to leave a conductive metal pattern on the surface of the substrate. As discussed above, in relation to the resist covered substrate, additional conductive layers may be placed upon the conductive pattern, preferably by a plating process. Suitable substrates include, but are not limited to glass and various transparent or translucent plastics. The metal layer may be formed of any conductive metal such as silver, gold, platinum, palladium, nickel, copper, tin, zinc, aluminum, etc. It is preferred that the metal layer be formed of copper due to its cost, availability and ease of etching and plating. The metal layer may be in the form of a metal foil or film which is embedded into or bonded onto the substrate surface. It may also be formed by vapor deposition, sputter coating or other deposition means which form a uniform metal layer on the substrate's surface. As stated above, the resultant pattern can be further plated or treated to render it more conductive.

If one desires to form a free standing conductive material incorporating the desired pattern, one can form a resist on a suitable mandrel, generally having a metal surface, expose and wash the resist, and etch the desired pattern into the mandrel's surface. A plating is then formed on the mandrel's surface such as by an electrodeposition bath. The plated material is then removed from the mandrel and applied like any other conductive mesh known in prior art to the transparent substrate.

The shielding capability of the present invention is equal to that of shielded devices using a mesh like grid. For example, a conductive substrate formed according to this invention, having circular elements of an average diameter of 0.010 inches and an average annulus width of 0.002 inches has a shielding capability comparable to that of a wire mesh shielding device having 100 openings per inch and a mesh diameter of 0.002 inches (a shielding capability of 60 dBs at 100 megahertz).

If desired, the substrate containing the conductive pattern may be curved, either before or after formation of the conductive pattern. Typically the curvature is formed after the formation of the conductive pattern by placing the substrate in an oven and allowing the substrate to soften and flow or slump to the correct curvature. If necessary, a mold or means for applying pressure to the substrate surface may be used to ensure the formation of the correct curvature.

The present invention may be used in a computer terminal as an EMI/RFI shield. It also has applications in the area of EMI/RFI shielded windows, such as in high security buildings and vehicles. It may also be used in applications that require a conductive or heated window such as a rear window defogger in an automobile. It is believed that in this application the conductive pattern is less distractive to the operator than the grid like formation that is currently in use.

Additionally, when the conductive pattern is formed as a freestanding material, it can be a replacement for knitted or braided conductive mesh used in forming conductive gaskets.

While the present invention has been described with reference to its preferred embodiments, other embodiments can achieve the same result. Variations and modifications of the present invention will be obvious to those skilled in the art and it is intended to cover in the appended claims all such modifications and equivalents as fall within the true spirit and scope of this invention.

What is claimed is:

1. A transparent article comprising a transparent substrate and an electrically conductive pattern on a surface of the substrate, the pattern being formed of a series of randomly oriented, non-linear, interconnecting elements and which pattern does not generate moiré patterns.

2. The transparent article of claim 1 wherein the electrically conductive pattern is selected from the group consisting of conductive metals and conductively filled adhesives, inks and frits.

3. The transparent article of claim 1 wherein the transparent substrate is selected from the group consisting of glass and rigid transparent plastics.

4. The transparent article of claim 1 wherein the elements are of a shape selected from the group consisting of circles, ovals, ellipses, and polygonals.

5. The transparent article of claim 1 further comprising a bus bar formed along at least one outer edge of the pattern, the bus bar being electrically conductive and in intimate contact with at least one edge of the pattern.

6. The transparent article of claim 1 wherein the elements are circular in shape of a diameter from about 0.002 inches to about 0.10 inches and an annular width of about 0.0002 inches to about 0.005 inches.

7. An EMI/RFI shielded device comprising a transparent or translucent substrate and an electrically conductive pattern on a surface of the substrate, wherein the pattern is formed of a series of interconnected, non-linear randomly oriented elements, such that the pattern does not generate a moiré pattern.

8. The EMI/RFI shielded device of claim 7 wherein the substrate is selected from the group consisting of glass and rigid plastics; and the elements are of a form selected from the group consisting of circles, ovals, ellipses, and polygons.

9. The EMI/RFI shielded device of claim 8 wherein the rigid plastics for the substrate are selected from the group consisting of polyvinyl butyrals, polyurethane, polyacrylates, and polycarbonates.

10. The EMI/RFI shielded device of claim 7 wherein the pattern is etched into the surface of the substrate.

11. The EMI/RFI shielded device of claim 7 wherein the pattern is and formed of an electrically conductive material selected from the group consisting of electrically conductive metals, electrically conductive inks, electrically conductive adhesives, electrically conductive fillers and electrically conductive frits.

12. The EMI/RFI shielded device of claim 7 further comprising a second substrate bonded to the surface of the first substrate upon which the pattern is formed so as to form a laminate.

13. A laminated shielded window comprising a first substrate, an electrically conductive pattern formed of a series of randomly oriented, non-linear interconnected elements on a surface of the first substrate, a bonding layer applied to the surface of the first substrate having the conductive pattern and a second substrate attached to a surface of the bonding layer formed on a surface opposite the surface attached to the first substrate, such that the pattern does not generate a moiré pattern.

14. The window of claim 13 wherein the first and second substrates are selected from the group consisting of glass and rigid plastics; and the elements have a shape selected from the group consisting of circles, ovals, elipses, and polygons.

15. The window of claim 13 wherein the elements are circular in shape and, having a diameter of from about 0.002 inches to about 0.10 inches and an annular width of from about 0.002 inches to about 0.005 inches.

16. The window of claim 13 wherein the elements of the pattern are formed of a conductive material selected from the group consisting of conductive metals, conductive inks, conductive adhesives and conductive frits.

17. The window of claim 13 further comprising a bus bar formed along at least one edge of the pattern and containing an electrical lead for establishing electrical conductivity between the pattern and a surface to which the window is mounted.

18. A transparent article comprising a transparent substrate and an electrically conductive pattern on a surface of the substrate, the pattern is formed of a series of randomly oriented, non-linear, interconnected elements, wherein the elements are of a shape selected from the group consisting of circles, ovals, ellipses and polygonals, such that the pattern does not generate a moiré pattern.

19. The transparent article of claim 18 wherein the elements are circular in shape, have a diameter of from about 0.002 inches to about 0.10 inches and an annular width of about 0.0002 inches to about 0.005 inches.

20. A transparent article comprising a transparent substrate and an electrically conductive pattern formed on a surface of the substrate, the pattern is formed of a series of randomly oriented, non-linear, interconnected elements, each element being of a shape selected from the group consisting of circles, ovals, ellipeses and polygonals and each element having a diameter from about 0.007 inches to about 0.10 inches and an annualr width from about 0.0002 inches to about 0.005, such that the pattern does not generate a moiré pattern.

* * * * *